(12) United States Patent
Ohlen

(10) Patent No.: US 10,712,367 B2
(45) Date of Patent: Jul. 14, 2020

(54) METHOD FOR ANALYZING A SIGNAL AS WELL AS MEASUREMENT AND ANALYZING DEVICE

(71) Applicant: Rohde & Schwarz GmbH & Co. KG, Munich (DE)

(72) Inventor: Volker Ohlen, Pliening (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 435 days.

(21) Appl. No.: 15/346,077

(22) Filed: Nov. 8, 2016

(65) Prior Publication Data
US 2018/0128857 A1 May 10, 2018

(51) Int. Cl.
*G01R 13/02* (2006.01)
(52) U.S. Cl.
CPC ................ *G01R 13/0254* (2013.01)
(58) Field of Classification Search
CPC ...................................... G01R 13/00
See application file for complete search history.

(56) References Cited

U.S. PATENT DOCUMENTS

| | | | | |
|---|---|---|---|---|
| 5,075,618 A * | 12/1991 | Katayama | ............ | G01R 23/165 324/121 R |
| 5,122,800 A * | 6/1992 | Philipp | ................. | H03M 1/462 341/122 |
| 6,311,138 B2 * | 10/2001 | Miller | ................. | G01R 13/345 702/125 |
| 2013/0231883 A1 * | 9/2013 | Smith | ................ | G01R 13/0254 702/68 |
| 2014/0142880 A1 * | 5/2014 | Dobyns | ................ | G01R 23/165 702/76 |

FOREIGN PATENT DOCUMENTS

WO  99/46608 A1  9/1999

OTHER PUBLICATIONS

Khan et al., Advance Oscilloscope Triggering:, IEEE Transactions on instrumentation and measurement, 56(3) 2007.*

* cited by examiner

*Primary Examiner* — Catherine T. Rastovski
(74) *Attorney, Agent, or Firm* — Schwabe, Williamson & Wyatt, P.C.

(57) ABSTRACT

A method for analyzing at least one signal by using a measurement and analyzing device is described. At least one measurement on said signal to be analyzed is conducted in order to obtain at least one measurement value. A diagram comprising said at least one measurement value over the time is provided. A curve of said at least one measurement value over the time is derived from said diagram. At least one trigger function is applied to said derived curve such that a trigger event is generated in case said at least one trigger function is triggered by said derived curve. Further, a measurement and analyzing device is described.

13 Claims, 3 Drawing Sheets

METHOD FOR ANALYZING A SIGNAL AS WELL AS MEASUREMENT AND ANALYZING DEVICE

TECHNICAL FIELD

The invention relates to a method for analyzing at least one signal by using a measurement and analyzing device and a measurement and analyzing device.

BACKGROUND OF THE INVENTION

Measurement and analyzing devices such as oscilloscopes are known in the state of the art in order to measure a time varying signal and visualize the signal as an acquired waveform on a display of the device. The acquired waveform may be visualized on an analog or a digital oscilloscope having a display wherein the analog and digital oscilloscopes have different characteristics, in particular regarding the trigger functions which may be applied to the acquired waveform.

Generally, the oscilloscopes have at least one trigger function for capturing interesting parts of the acquired waveform for clear signal characterization since the trigger is the determining point in the acquired waveform. Thus, the trigger function makes a repetitive waveform look static. Thus, the different trigger functions are used to visualize the different waveforms in the desired manner for analyzing purposes.

Further, it is known in the state of the art that certain measurements on the acquired waveform or rather the signal to be analyzed may be conducted for obtaining measurement values that can also be displayed. These measurement values may be displayed as a curve which is also called track. Thus, the track is based on measurement values which have been obtained by performing measurements on the acquired waveform(s).

Usually, the user of the measurement and analyzing device has to check the track by visual inspection in order to detect a special behavior and/or anomalies. However, the user may miss an anomaly unintentionally. Thus, there is a need to simplify and improve the analysis.

SUMMARY OF THE INVENTION

The invention provides a method for analyzing at least one signal by using a measurement and analyzing device, with the following steps:
a) Conducting at least one measurement on said signal to be analyzed in order to obtain at least one measurement value,
b) Providing a diagram comprising said at least one measurement value over the time,
c) Deriving a curve of said at least one measurement value over the time from said diagram, and
d) Applying at least one trigger function to said derived curve such that a trigger event is generated in case said at least one trigger function is triggered by said derived curve.

Further, the invention provides a measurement and analyzing device for analyzing at least one signal, said measurement and analyzing device comprising a display and a processing unit, said processing unit being configured to execute a method for analyzing at least one signal with the following steps:
a) Conducting at least one measurement on said signal to be analyzed in order to obtain at least one measurement value,
b) Providing a diagram comprising said at least one measurement value over the time,
c) Deriving a curve of said at least one measurement value over the time from said diagram, and
d) Applying at least one trigger function to said derived curve such that a trigger event is generated in case said at least one trigger function is triggered by said derived curve.

The invention is based on the finding that the analysis of the derived curve representing the measurement value(s) over time, also called track, is simplified by applying at least one trigger function on that track. Thus, a trigger event is generated provided that a special behavior and/or an anomaly occur(s) with respect to the track. The trigger event clearly indicates the position in the track on the display of the measurement and analyzing device. Thus, the user easily recognizes at which position of the track the special behavior and/or the anomaly occur(s). Hence, the user of the measurement and analyzing device does not have to analyze the track by visual inspection which simplifies and accelerates the analysis. Further, there is no more risk that the user misses a certain anomaly and/or special behavior since the trigger function applied generates a dedicated trigger event provided that the corresponding anomaly and/or special behavior occur(s). Generally, the track or rather the derived curve is a record of measurement values over the time.

In other words, the track or rather the derived curve is a generated signal which is not inputted since the derived curve (track) is derived from the measurement values which have been obtained by conducting measurement(s) on said signal input. Thus, the derived curve (track) can be deemed as an artificial signal as it is generated by the measurement and analysis device itself based upon the signal to be analyzed which has been input previously.

According to an aspect, said measurement is conducted on an acquired waveform of said signal and/or decoded values. The several decoded values represent the signal to be analyzed. The acquired waveform directly corresponds to the signal to be analyzed wherein the acquired waveform is typically displayed on the measurement and analysis device as a steady waveform for analyzing purposes.

According to another aspect, said trigger event is automatically generated by said device. Since the trigger function is processed by the processing unit of the measurement and analysis device which also processes the data to be displayed, the trigger event is generated automatically once an anomaly and/or special behavior is detected.

Particularly, said trigger event is displayed on a display of said device. Thus, the user can easily recognize the position and eventually analyze any further effects which might relate to the anomaly and/or special behavior. Accordingly, the user might analyze the reason for the anomaly and/or special behavior.

According to a further aspect, said at least one trigger function is a mask trigger, a zone trigger, an edge trigger, a threshold trigger, an analog edge trigger, a glitch trigger, a width trigger, a runt trigger, a window trigger a timeout trigger, an interval trigger, a slew rate trigger, a data2clock trigger, a state trigger, a pattern trigger, a serial pattern trigger, a Near Field Communication (NFC) trigger, a TV/Video Trigger, a Clock Data Recovery (CDR) Trigger, a hold-off trigger, a pulse width trigger, a windows pulse width trigger, a level dropout trigger, logical trigger or a digital trigger. These different trigger functions are known for analyzing an acquired waveform. Accordingly, each of these different trigger functions can also be used for analyzing the track or rather the derived curve in an analog manner. Depending on the measurements conducted and, thus, the measurement values obtained to be displayed, certain trigger functions might be more interesting for analyzing purposes than other ones. However, the user may select the desired trigger function from the list mentioned above for analyzing a certain aspect of the derived curve (track).

Multiple trigger functions may be applied successively. Thus, different trigger functions may be applied one by one. A certain sequence of trigger functions may be predetermined which are processed depending on preset conditions automatically. Alternatively, the user may select one trigger function after another trigger function manually.

According to another aspect, multiple trigger functions are applied simultaneously. Furthermore, different trigger functions can be applied on one and the same curve derived (track). Thus, a trigger event is generated when at least one of the several trigger functions is triggered by the curve derived. Moreover, different measurements on the signal to be analyzed can be conducted such that different tracks are obtained. These different derived curves (tracks) may be displayed in certain regions of the display. Thus, the user can analyze different aspects in a short time, in particular simultaneously, as the different tracks are displayed on the display simultaneously.

According to an embodiment, said measurement and analyzing device is an oscilloscope. An oscilloscope is typically used for analyzing signals, applying trigger functions on the acquired waveform of the signal and conducting measurements with regard to the acquired waveform or rather the signal to be analyzed.

Alternatively, the measurement and analyzing device is a multi-function device which has several functions such as an oscilloscope function amongst others.

Particularly, said oscilloscope is a digital oscilloscope. Accordingly, several trigger functions may be used which cannot be applied when using an analog oscilloscope. Hence, the functionality of the oscilloscope is increased.

Moreover, said digital oscilloscope may have a data storage for storing data obtained and/or processed. Measurement values obtained may be stored in the data storage such that these data can be used for comparison afterwards. For instance, a histogram can be generated illustrating how often a certain anomaly and/or a special behavior has been detected by the selected trigger function during a certain time.

Furthermore, said device may be a handheld device. Thus, the user can use the device everywhere resulting in a high flexibility. The device may comprise a battery unit in order to ensure the required power supply.

Alternatively, the device is a laboratory apparatus. The laboratory apparatus may have a plug for ensuring the required power supply.

BRIEF DESCRIPTION OF DRAWINGS

The invention will now be described with reference to an exemplary embodiment which is shown in the enclosed drawings. In the drawings, FIG. 1 schematically shows a measurement and analyzing device according to the invention.

DETAILED DESCRIPTION

Figure 1:
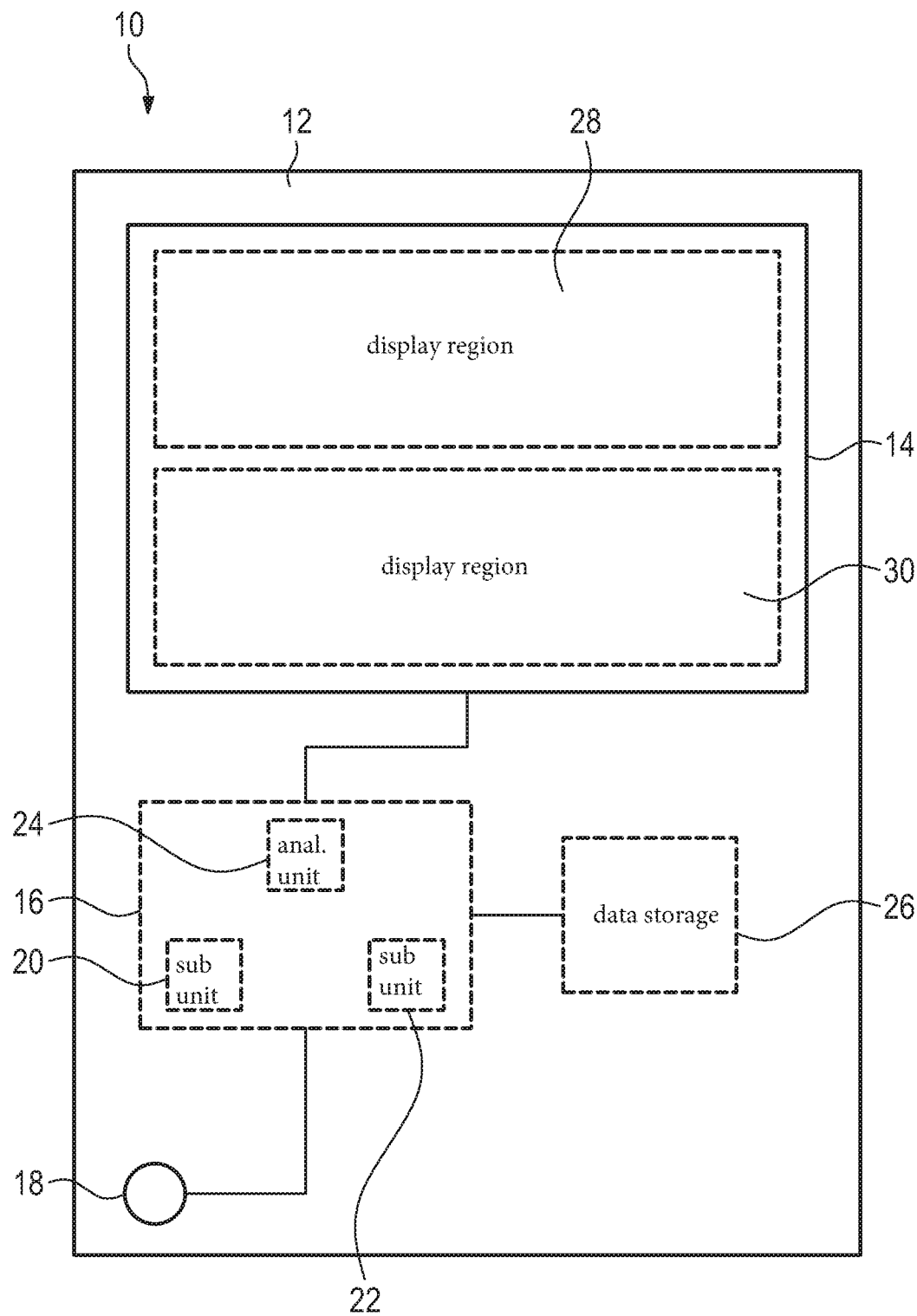

In FIG. 1, a measurement and analysis device 10 for analyzing at least one signal is schematically shown, in particular a handheld digital oscilloscope.

The measurement and analysis device 10 comprises a housing 12, a display 14, in particular a touch display, and a processing unit 16 being housed in the housing 12.

Further, an input 18 is provided for receiving the signal to be analyzed. The input 18 may be a coaxial port or any other suitable port for receiving a signal to be analyzed. The signal to be analyzed might be a signal originated from a certain source, for instance an electromagnetic signal from a radio frequency source such as a sine wave, or several decoded values, in particular serial decoded values, which represent the signal to be analyzed.

The signal received via the input 18 is internally forwarded to the processing unit 16 which is positioned between the input 18 and the display 14. Thus, the signal to be analyzed is processed by the processing unit 16 such that the data obtained corresponding to the signal to be analyzed can be displayed on the display 14 in an accurate manner.

The processing unit 16 has several sub units for processing the signal to be analyzed such that data is gathered which can be displayed on the display 14.

In the shown embodiment, the processing unit 16 has two measurements sub units 20, 22 that are configured to measure different measurement values of the signal to be analyzed. For instance, measurement sub unit 20 is configured to measure the frequency of the signal to be analyzed which might be an electromagnetic signal received by a certain source such as a radio frequency source.

The obtained measurement values can be used in order to provide a diagram wherein the measurement values are illustrated over the time. Hence, a curve is derived by the processing unit 16 which corresponds to the measurement values obtained over the time. This derived curve is also called track. Accordingly, the derived curve (track) is different to the acquired waveform which is input directly since the derived curve (track) is a signal generated by the device 10 itself, in particular the processing unit 16, based upon the signal to be analyzed which has been input via the input 18. As already mentioned, the derived curve comprises the measurement values which has been obtained by conducting the at least first measurement, for instance via the measurement sub unit 20 of the processing unit 16.

The processing unit 16 may also have another sub unit which is a mathematics and analysis unit 24 for processing the measurement values obtained by the respective measurement sub unit 20, 22 such that the corresponding data can be displayed appropriately on the display 14.

Further, a data storage 26 may be provided which is connected to the processing unit 16 such that the data processed can be stored for further analyzing purposes. Particularly, histograms of the measurement values and/or histograms of the trigger events can be generated accordingly since the trigger events are stored at least for a certain time.

In the shown embodiment, the display 14 has at least two display regions 28, 30 which may be used to display the acquired waveform as well as the track or rather the derived curve which is generated by the processing unit 16 while conducting at least one measurement on the signal to be analyzed which has been input via the input 18 previously.

The derived curve (track) may be a signal composed of measurement parameter(s) arranged in the order the different measurements have been performed. Therefore, the derived curve may comprise several thousands single values, in particular millions of single values.

Figure 2:
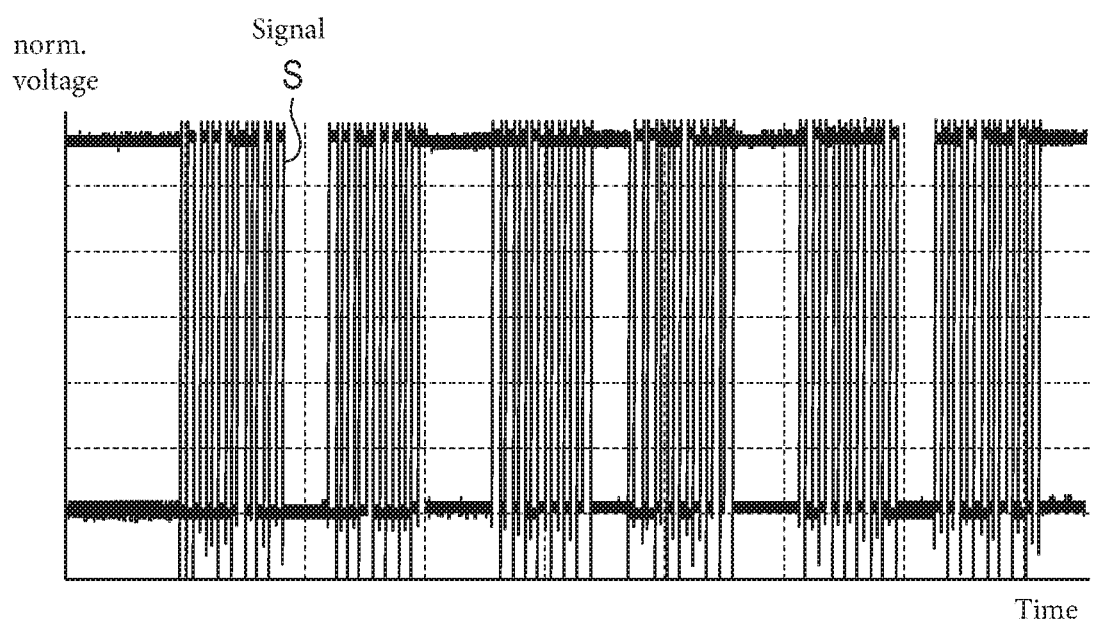
FIG. 2 shows a diagram comprising a signal to be analyzed based on decoded values.
Figure 3:
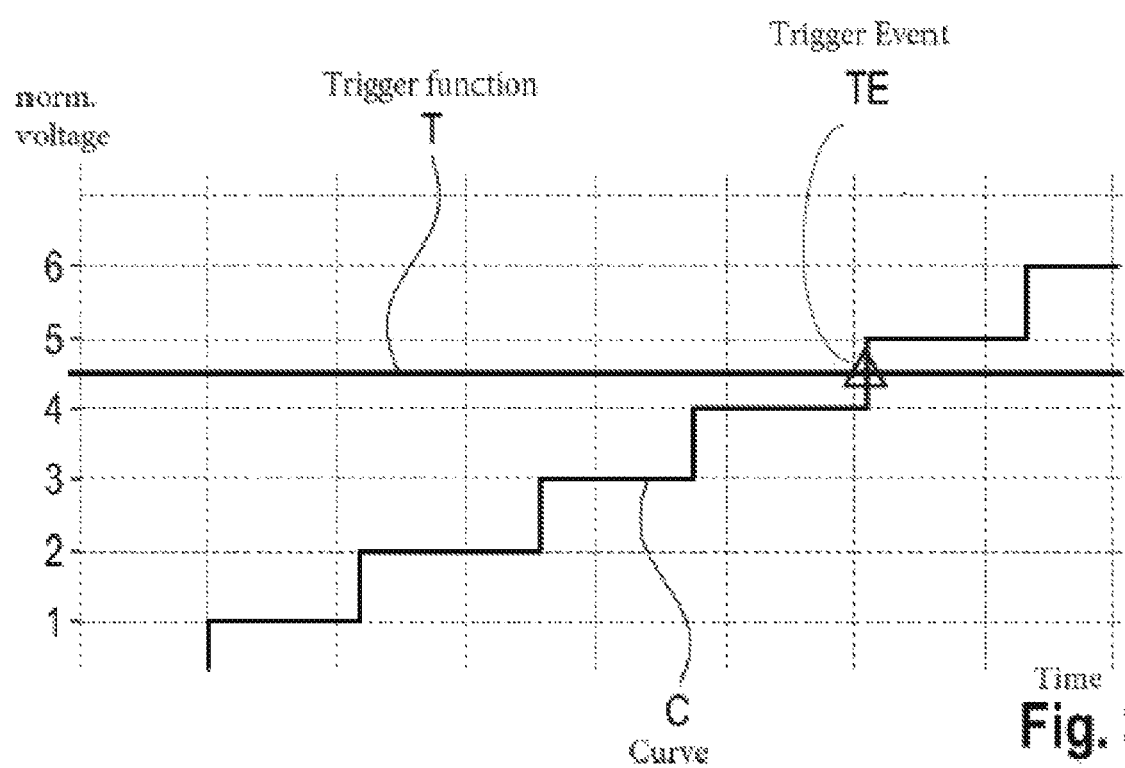
FIG. 3 shows a diagram illustrating the curve derived from the signal shown in FIG. 2 with a certain trigger function applied and triggered by the curve derived.

In FIG. 2, a diagram comprising a signal to be analyzed S based on decoded values is shown wherein in FIG. 3 a diagram is shown that illustrates the curve derived C from the signal S shown in FIG. 2 after at least one measurement has been conducted.

For instance, the diagram shown in FIG. 2 may be displayed in the display region 28 whereas the diagram shown in FIG. 3 may be displayed in the display region 30. Thus, both diagrams shown in FIGS. 2 and 3 can be displayed on the same display 14, simultaneously.

Further, a trigger function T is applied on the derived curve (track) C shown in the diagram in FIG. 3 wherein the selected trigger function T is an edge trigger which is triggered when the derived curve (track) C reaches a predetermined threshold being illustrated as a horizontal line. Thus, the edge trigger can also be called a threshold trigger.

As shown in FIG. 3, the trigger function T is hit by the derived curve (track) C on the rising edge of the derived curve (track) C. Thus, a trigger event TE is generated which is shown on the display 14, in particular as a triangle in the upper portion of the display region 30. This trigger event TE is automatically generated without any manual input.

Thus, the user can easily determine at which position on the derived curve (track) C, the trigger event TE takes place. As already mentioned, the threshold value is displayed as a horizontal line whereas the exact position of the trigger event TE is specified by the triangle which is displayed when the trigger function T is triggered by the derived curve (track) C.

Figure 4:
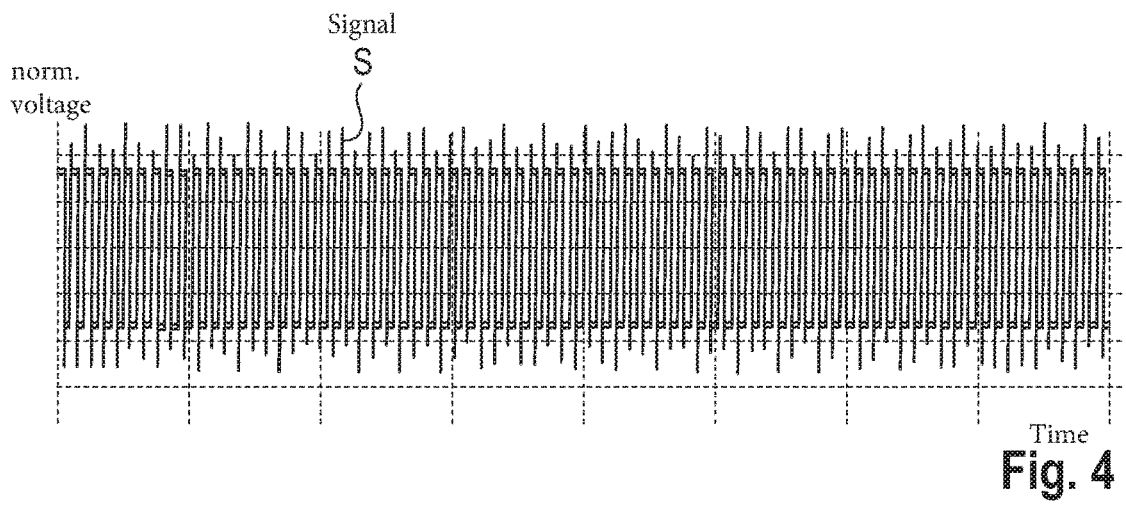
FIG. 4 shows a diagram comprising a signal to be analyzed.
Figure 5:
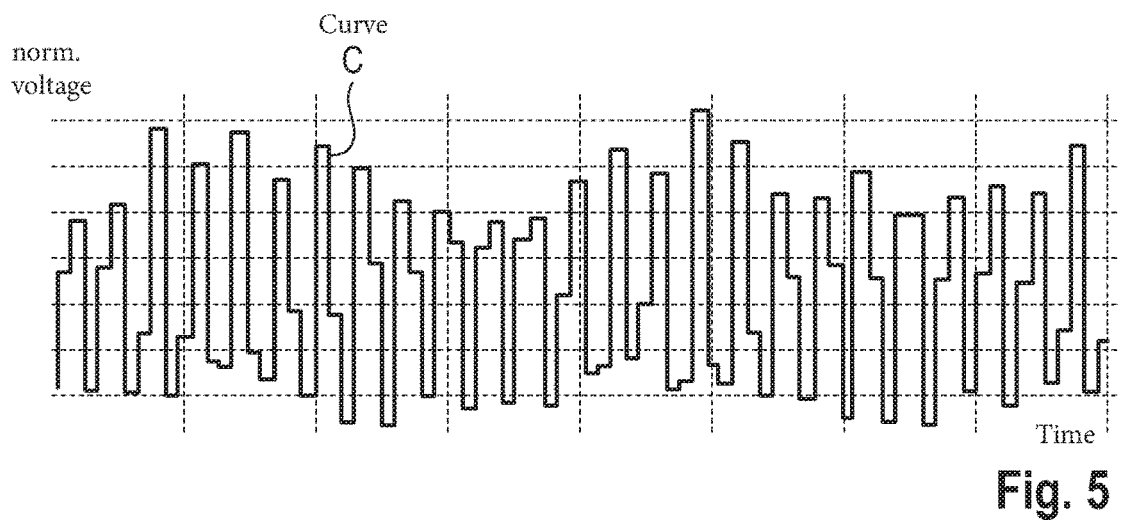
FIG. 5 shows a diagram illustrating the curve derived from the signal shown in FIG. 4 based on a frequency measurement without a trigger function being applied.

In FIG. 4, a diagram is shown that comprises a signal to be analyzed S based on a frequency measurement wherein FIG. 5 shows a diagram illustrating the curve derived C from the signal S shown in FIG. 4 without a trigger function being applied. In contrast thereto, FIG. 6 shows a diagram illustrating the curve derived C from the signal S shown in FIG. 4 wherein a trigger function T is applied on that derived curve (track) C.

Figure 6:
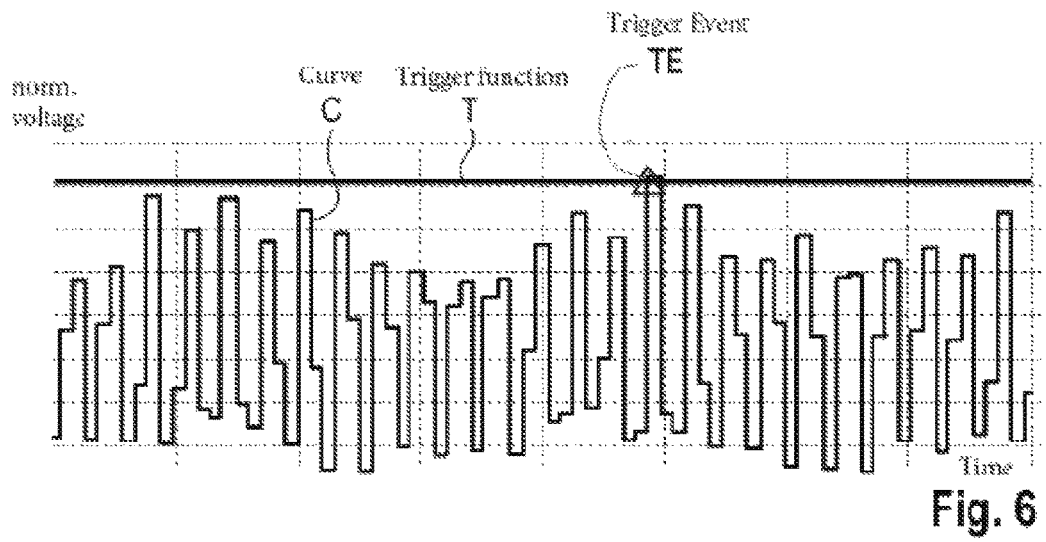
FIG. 6 shows the diagram of FIG. 5 with a certain trigger function being applied and triggered by the curve derived.

Once again, the diagram shown in FIG. 4 may be displayed in the displayed in the display region 28 whereas the diagram shown in FIG. 5 or 6 may be displayed in the display region 30. Thus, the diagrams illustrating the acquired waveform (FIG. 4) and the derived curve C (FIG. 5 or FIG. 6) can be displayed on the same display 14, simultaneously.

The derived curve (track) C shown in FIGS. 5 and 6 is derived by conducting a certain measurement, in particular a frequency measurement of the signal to be analyzed S.

The comparison of the diagrams shown in FIGS. 4 and 5 points out that the derived curve (track) C and the acquired waveform of the signal to be analyzed S are different.

The diagram shown in FIG. 6 in comparison to the diagram shown in FIG. 5 illustrates the differences displayed when a trigger function T such as an edge trigger function is applied and hit by the derived curve (track) C.

As soon as the derived curve (track) C reaches the predetermined value of the trigger function T, the trigger function T is triggered such that a trigger event TE is generated automatically. The generated trigger event TE is displayed on the display 14, in particular in the diagram shown in the display region 30 of the display 14.

Again, the threshold value of the trigger function T is displayed as a horizontal line as well as a triangle at the dedicated location on the x-axis representing the exact position of the trigger event TE. Thus, the user can easily recognize at which location the trigger event TE occurs.

Beside the shown edge trigger function, several other trigger functions can be applied such as a mask trigger, a zone trigger, an analog edge trigger, a glitch trigger, a width trigger, a runt trigger, a window trigger a timeout trigger, an interval trigger, a slew rate trigger, a data2clock trigger, a state trigger, a pattern trigger, a serial pattern trigger, a NFC trigger, a TV/Video Trigger, a CDR Trigger, a hold-off trigger, a pulse width trigger, a windows pulse width trigger, a level dropout trigger, logical trigger or a digital trigger.

These different trigger functions can be applied subsequently wherein a predetermined order of the trigger functions is applied automatically provided that preset conditions are fulfilled.

Alternatively, the user may manually select certain trigger functions which are applied one after another.

Furthermore, several trigger functions may be applied simultaneously. These trigger functions can be applied on the same derived curve (track) such that the derived curve (track) and the corresponding applied trigger function are displayed in different display regions 28, 30. Alternatively, the same derived curve (track) is displayed in a certain display region 28, 30 wherein the trigger event is generated for the trigger function of the several trigger functions which is hit first.

Moreover, different derived curves (tracks) may be obtained when different measurements are conducted. Each of the derived curves (tracks) may be displayed in a corresponding display region 28, 30 on the display 14 wherein one or more trigger function(s) may be applied on the derived curves (tracks) appropriately.

Generally, the device 10 may be a handheld device as shown in FIG. 1 such that the device 10 is mobile. Thus, the user can use the device 10 everywhere. Accordingly, the device 10 may have a battery unit ensuring the required power supply.

Alternatively, the device 10 may be a laboratory apparatus. Then, the required power supply of the device 10 can be easily ensured by a plug. However, a battery unit may also be provided in case that the laboratory apparatus is used at a place without any socket.

Moreover, the device 10 may have further analyzing functions such as a spectrum analyzing function, for instance. Hence, the device 10 may be used for further analyzing purposes. Thus, the device 10 can be a multifunctional device having a oscillation function amongst others.

In general, the analysis of a signal to be analyzed is simplified and further automated.

The invention claimed is:

1. A method for using a measurement and analyzing device including a hardware processing unit and a display device to analyze a signal, the method comprising:
responsive to receiving said signal, storing said signal in a data storage as an acquired waveform;

displaying with the hardware processing unit the acquired waveform in a first display region of the display device;

conducting with the hardware processing unit at least one measurement on said signal in order to obtain measurement values, said measurement being conducted on the acquired waveform of said signal;

deriving with the hardware processing unit a curve of said measurement values over time, said curve being generated by said measurement and analyzing device rather than inputted to said measurement and analyzing device;

displaying with the hardware processing unit said curve in a second display region of the display device;

applying with the hardware processing unit at least one trigger function to said curve such that a trigger event is generated when said at least one trigger function is triggered by said curve; and displaying with the hardware processing unit on the display device the trigger event at a position in the curve where the trigger function is triggered.

2. The method according to claim 1, wherein said trigger event is automatically generated by said device.

3. The method according to claim 1, wherein said trigger event identifies an anomaly in said measurement values.

4. The method according to claim 1, wherein said at least one trigger function is a mask trigger, a zone trigger, an edge trigger, a threshold trigger, an analog edge trigger, a glitch trigger, a width trigger, a runt trigger, a window trigger a timeout trigger, an interval trigger, a slew rate trigger, a data2clock trigger, a state trigger, a pattern trigger, a serial pattern trigger, a NFC trigger, a TV/Video Trigger, a CDR Trigger, a hold-off trigger, a pulse width trigger, a windows pulse width trigger, a level dropout trigger, logical trigger or a digital trigger.

5. The method according to claim 1, wherein multiple trigger functions are applied successively.

6. The method according to claim 1, wherein multiple trigger functions are applied simultaneously.

7. A method for measuring and analyzing at least one signal with a measurement and analyzing device, said measurement and analyzing device comprising a display device and a processing unit, said processing unit being configured to execute a method for analyzing at least one signal, said method executed by said processing unit comprising:

responsive to receiving said signal, storing said signal in a data storage as an acquired waveform;

conducting at least one measurement on said at least one signal to be analyzed in order to obtain measurement values, said measurement being conducted on the acquired waveform of said signal;

deriving a curve of said measurement values over time, said curve being generated by said measurement and analyzing device rather than inputted to said measurement and analyzing device;

displaying said curve in a display region of on the display device;

applying at least one trigger function to said curve such that a trigger event is generated in case said at least one trigger function is triggered by said derived curve, wherein said curve is derived from said measurement values which have been obtained by conducting at least one measurement on said signal to be analyzed; and displaying on the display device the trigger event at a position in the curve where the trigger function is triggered.

8. The method according to claim 7, wherein said measurement and analyzing device is an oscilloscope.

9. The method according to claim 8, wherein said oscilloscope is a digital oscilloscope.

10. The method according to claim 9, wherein said digital oscilloscope has a data storage for storing data obtained and/or processed.

11. The method according to claim 7, wherein said device is a handheld device.

12. The method according to claim 7, wherein said at least one trigger function is a mask trigger, a zone trigger, an edge trigger, a threshold trigger, an analog edge trigger, a glitch trigger, a width trigger, a runt trigger, a window trigger a timeout trigger, an interval trigger, a slew rate trigger, a data2clock trigger, a state trigger, a pattern trigger, a serial pattern trigger, a NFC trigger, a TV/Video Trigger, a CDR Trigger, a hold-off trigger, a pulse width trigger, a windows pulse width trigger, a level dropout trigger, logical trigger or a digital trigger.

13. A method for using a measurement and analyzing device including a hardware processing unit and a display device to analyze a signal, the method comprising:

responsive to receiving said signal, storing said signal in a data storage as an acquired waveform conducting with the hardware processing unit at least one measurement on the acquired waveform of said signal in order to obtain measurement values, said measurement being conducted on the acquired waveform of said signal;

deriving with the hardware processing unit a curve of said measurement values over time said curve being generated by said measurement and analyzing device rather than inputted to said measurement and analyzing device;

applying with the hardware processing unit at least one trigger function to said curve such that a trigger event is generated when said at least one trigger function is triggered by said curve representing the measurement values over time; and displaying with the hardware processing unit said curve in a display region of the display device, and displaying the trigger event at a position in said curve where the trigger function is triggered.

* * * * *